(12) United States Patent
Yamada

(10) Patent No.: US 9,166,554 B2
(45) Date of Patent: Oct. 20, 2015

(54) FLEXURAL RESONATOR ELEMENT, RESONATOR, OSCILLATOR, AND ELECTRONIC DEVICE

(71) Applicant: Seiko Epson Corporation, Tokyo (JP)

(72) Inventor: Akinori Yamada, Ina (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 13/915,001

(22) Filed: Jun. 11, 2013

(65) Prior Publication Data

US 2013/0270970 A1    Oct. 17, 2013

Related U.S. Application Data

(63) Continuation of application No. 13/176,192, filed on Jul. 5, 2011, now Pat. No. 8,482,358.

(30) Foreign Application Priority Data

Jul. 9, 2010  (JP) .................................. 2010-156576

(51) Int. Cl.
*H03H 9/21* (2006.01)
*H03H 9/02* (2006.01)
(Continued)

(52) U.S. Cl.
CPC ............. *H03H 9/21* (2013.01); *H03H 9/02102* (2013.01); *H03H 9/0519* (2013.01); *H03H 9/1021* (2013.01)

(58) Field of Classification Search
CPC ...................................................... H03H 9/21

USPC ..................................... 331/156, 344; 310/344
See application file for complete search history.

(56) References Cited

U.S. PATENT DOCUMENTS

| 7,193,354 B2 | 3/2007 | Kawashima |
| 7,626,318 B2 | 12/2009 | Dalla Piazza et al. |
| 8,164,393 B2 | 4/2012 | Yamada |

(Continued)

FOREIGN PATENT DOCUMENTS

| JP | S58-63212 | 4/1983 |
| JP | U-2-32229 | 2/1990 |

(Continued)

OTHER PUBLICATIONS

Mar. 5, 2013 Notice of Allowance issued in U.S. Appl. No. 13/176,192.

(Continued)

*Primary Examiner* — Joseph Chang
(74) *Attorney, Agent, or Firm* — Oliff PLC

(57) ABSTRACT

A crystal resonator element include a pair of resonating arms extending from a base, the resonating arms includes a groove, a slope portion is formed in a connection portion of the resonating arms to the base so that a distance between the groove and the outer edge of each of the resonating arms increases as it approaches the base from the resonating arms, and a non-electrode region which extends over a range of areas from a connection portion connected to a first side surface formed along the longitudinal direction of the groove and a connection portion connected to a second side surface facing the first side surface with a bottom portion disposed there between and in which excitation electrodes are not formed is provided in the groove in at least a part of the bottom portion positioned in the slope portion.

14 Claims, 7 Drawing Sheets

(51) Int. Cl.
*H03H 9/05* (2006.01)
*H03H 9/10* (2006.01)

(56) References Cited

U.S. PATENT DOCUMENTS

| | | | |
|---|---|---|---|
| 8,482,358 B2* | 7/2013 | Yamada | 331/156 |
| 2005/0104480 A1 | 5/2005 | Tanaya | |
| 2007/0159029 A1 | 7/2007 | Aratake | |
| 2008/0084251 A1 | 4/2008 | Takahashi | |
| 2009/0212668 A1 | 8/2009 | Sugiyama | |
| 2010/0029898 A1 | 2/2010 | Cirakovic | |
| 2010/0164331 A1 | 7/2010 | Yamada | |
| 2010/0171397 A1 | 7/2010 | Yamada | |
| 2010/0244989 A1 | 9/2010 | Furuhata et al. | |

FOREIGN PATENT DOCUMENTS

| | | |
|---|---|---|
| JP | A-2000-223992 | 8/2000 |
| JP | A-2003-133895 | 5/2003 |
| JP | A-2006-050186 | 2/2006 |
| JP | A-2006-352771 | 12/2006 |
| JP | A-2007-158386 | 6/2007 |
| JP | A-2009-27711 | 2/2009 |
| JP | A-2010/050960 | 3/2010 |
| JP | A-2010-157933 | 7/2010 |
| JP | A-2010-171965 | 8/2010 |
| JP | A-2010-171966 | 8/2010 |
| JP | A-2010-226608 | 10/2010 |
| JP | A-2010-226610 | 10/2010 |
| JP | A-2010-233204 | 10/2010 |
| JP | A-2010-252302 | 11/2010 |
| JP | 2011-166324 A | 8/2011 |
| TW | 200952333 A | 12/2009 |
| WO | WO 00/44092 | 7/2000 |

OTHER PUBLICATIONS

Oct. 23, 2012 Office Action issued in U.S. Appl. No. 13/176,192.

* cited by examiner

FLEXURAL RESONATOR ELEMENT, RESONATOR, OSCILLATOR, AND ELECTRONIC DEVICE

CROSS-REFERENCE TO RELATED APPLICATIONS

This is a Continuation of U.S. application Ser. No. 13/176,192 filed Jul. 5, 2011, which claims priority to Japanese Patent Application No. 2010-156576 filed Jul. 9, 2010, the disclosure of which is incorporated herein by reference in its entirety.

BACKGROUND

1. Technical Field

The present invention relates to a flexural resonator element, and a resonator, an oscillator, and an electronic device each having the flexural resonator element.

2. Related Art

In the related art, the fact that when a flexural resonator element is miniaturized, the Q value decreases and the flexural vibration thereof is disturbed is known. Here, the Q value is a dimensionless number representing the vibration state, and the higher it is, the more stably the flexural resonator element vibrates. This results from a thermoelastic effect which occurs when a relaxation vibration frequency that is inversely proportional to the relaxation time up to the equilibrium of temperature through heat transfer approaches a vibration frequency of the flexural resonator element. That is, when a flexural resonator element vibrates in the flexural vibration mode, an elastic deformation occurs, and the temperature of a compressed surface increases while the temperature of an expanded surface decreases. Thus, a temperature difference occurs in the inner portion of the flexural resonator element. The flexural vibration is disturbed by relaxation vibration of which the frequency is inversely proportional to the relaxation time up to equilibrium of the temperature difference through thermal conduction, and the Q value decreases.

In order to address this problem, JP-UM-A-2-32229 (see page 4 line 7 to page 5 line 3) discloses a technique in which a groove or a through-hole is formed in a flexural vibration portion of a flexural resonator element to prevent the transfer of generated heat from the compressed surface of a resonator to the expanded surface, thus suppressing changes in the Q value resulting from the thermoelastic effect.

Moreover, JP-A-2009-27711 (see FIG. 1 and FIG. 1a) discloses a piezoelectric tuning fork-type resonator (hereinafter referred to as a flexural resonator element). The flexural resonator element includes abase from which first and second parallel resonating arms extend, an enlarged portion (hereinafter referred to as a weight portion) having a flipper-like shape forming the free end of each of the resonating arms, and an excitation electrode for resonating each resonating arm, and a groove formed on at least one of the top or bottom surfaces of each of the resonating arms.

In the flexural resonator element having the groove as disclosed in JP-UM-A-2-32229, the groove prevents the diffusion (thermal conduction) of the heat generated by flexural vibration. Thus, it is possible to suppress thermoelastic loss which is a loss of vibration energy caused by thermal conduction occurring between the contracted portion and the expanded portion of a flexural resonator element resonating in the flexural vibration mode.

However, the flexural resonator element having the groove as described above has a portion which is disposed in a connection portion connected to the base of the resonating arm and in which larger stress occurs due to flexural vibration than other portions of the resonating arm. Thus, a large temperature difference occurs in the flexural resonator element when the temperature rises and falls.

Moreover, in the groove positioned in the connection portion of the resonating arm connected to the base, an excitation electrode is continuously formed on the surface thereof so as to extend from one side in the width direction of the resonating arm to the other side. Therefore, thermal conduction in the connection portion of the resonating arm connected to the base is accelerated by the excitation electrode that is formed of a metal having high thermal conductivity and formed on the groove in the connection portion. The present inventor has found a problem wherein the thermoelastic loss increases and the Q value decreases.

According to FIG. 1 of JP-A-2009-27711, the flexural resonator element has a slope portion (tapered portion) which is formed between the resonating arm and the base so that the distance between the groove and the outer edge of the resonating arm increases as it approaches the base from the resonating arm in plan view.

According to FIG. 1 and FIG. 1a of JP-A-2009-27711, in the flexural resonator element, the excitation electrode formed in the groove extends up to a range corresponding to the connection portion and is formed in the inner wall of the groove so as to be continuous from one end in the width direction of the resonating arm to the other end thereof.

SUMMARY

The present inventors found that, due to this configuration, in the flexural resonator element, the thermal conduction in the slope portion which does not contribute to excitation of the flexural vibration of the resonating arm is accelerated by the excitation electrode that is formed of a metal having high thermal conductivity and formed in the bottom portion of the groove corresponding to the slope portion, and as a result, the thermoelastic loss increases and the Q value decreases.

An advantage of some aspects of the invention is to solve at least a part of the problems described above and the invention can be implemented as the following forms or application examples.

APPLICATION EXAMPLE 1

According to this application example of the invention, there is provided a flexural resonator element including: a base; and a resonating arm which extends from the base and has a connection portion disposed close to the base and connected to the base and which vibrates in a flexural vibration mode, wherein the resonating arm has a groove which is formed on a principal surface thereof along the longitudinal direction of the resonating arm to be continuous to the connection portion, wherein an excitation electrode is disposed in the groove, and wherein a part of the groove is disposed in the connection portion, and has a non-electrode region in which the excitation electrode is not formed.

According to this configuration, in the flexural resonator element, a part of the groove is disposed in the connection portion, and has the non-electrode region in which the excitation electrode is not formed.

As a result, in the flexural resonator element, the thermal conductivity in the non-electrode region of the groove disposed in the connection portion of the resonating arm decreases as compared to a case in which the excitation electrode is formed. Thus, for example, the transfer of heat from the contracted portion during the flexural vibration to the expanded portion is slowed down. Accordingly, it is possible to suppress the thermoelastic loss of the connection portion.

Therefore, in the flexural resonator element, it is possible to improve the Q value as compared to a case in which an electrode is formed in the groove disposed in the connection portion of the resonating arm.

APPLICATION EXAMPLE 2

In the flexural resonator element of the above application example, it is preferable that the resonating arm has a shape such that the width of the connection portion between the groove and the outer edge of the resonating arm on the principal surface increases as it approaches the base from the tip end of the resonating arm.

According to this configuration, in the flexural resonator element, the distance of the connection portion between the groove and the outer edge of the resonating arm on the principal surface increases as it approaches the base from the tip end of the resonating arm, and the non-electrode region in which the excitation electrode is not formed is provided in at least a part of the groove that is disposed in the connection portion.

As a result, in the flexural resonator element, due to the reasons described above, it is possible to suppress the thermoelastic loss of the connection portion and to improve the Q value.

APPLICATION EXAMPLE 3

In the flexural resonator element of the above application example, it is preferable that the excitation electrode has first and second excitation electrode portions, the first excitation electrode portion is disposed on one side in the width direction of the resonating arm in the inner wall of the part of the groove, and the second excitation electrode portion is disposed on the other side, and the non-electrode region is disposed between the first and second excitation electrode portions.

According to this configuration, in the flexural resonator element, the first excitation electrode portion is disposed on one side in the width direction of the resonating arm in the inner wall of the part of the groove, and the second excitation electrode portion is disposed on the other side. Therefore, it is possible to decrease the CI (Crystal Impedance) value (which is a value serving as an indicator of the likelihood of oscillation, and the lower it is, the more the flexural resonator element is likely to oscillate) as compared to a case in which the excitation electrode is not formed in the groove disposed in the connection portion.

APPLICATION EXAMPLE 4

In the flexural resonator element of the above application example, it is preferable that the groove includes: a first side surface extending along the longitudinal direction of the resonating arm; a second side surface extending along the longitudinal direction of the resonating arm; and a bottom portion connecting the first and second side surfaces and forming the bottom of the groove, a part of the bottom portion is disposed in the connection portion, and the non-electrode region is provided in at least a part thereof, and the groove has the excitation electrode which is disposed on the entire area of the first and second side surfaces in plan view.

According to this configuration, the flexural resonator element has the excitation electrode which is formed on the entire area of the first and second side surfaces of the groove. Therefore, it is possible to decrease the CI value as compared to a case described later in which the excitation electrode is formed in a part of the first and second side surfaces of the groove.

Therefore, in the flexural resonator element, it is possible to improve the Q value as compared to a case in which the excitation electrode is formed in a part of the first and second side surfaces of the groove.

APPLICATION EXAMPLE 5

In the flexural resonator element of the above application example, it is preferable that the groove includes: a first side surface extending along the longitudinal direction of the resonating arm; a second side surface extending along the longitudinal direction of the resonating arm; and a bottom portion connecting the first and second side surfaces and forming the bottom of the groove, a part of the bottom portion is disposed in the connection portion, and the non-electrode region is provided in at least a part thereof, and the groove has the excitation electrode which is disposed in a part of the first side surface and a part of the second side surface in plan view.

According to this configuration, in the flexural resonator element, the excitation electrode is formed in a part of the first and second side surfaces of the groove. Therefore, it is possible to decrease the load capacitance sensitivity (which indicates the amount of change in the frequency with changes in the load capacitance, and the lower it is, the less the frequency is likely to change) as compared to the above-described case in which the excitation electrode is formed on the entire area of the first and second side surfaces.

Therefore, in the flexural resonator element, it is possible to suppress changes in the frequency resulting, for example, from floating capacitance or the like as compared to a case in which the excitation electrode is formed on the entire area of the first and second side surfaces of the groove.

APPLICATION EXAMPLE 6

In the flexural resonator element of the above application example, it is preferable that the bottom portion disposed in the connection portion has a sloped surface in which the depth of the groove increases as it approaches the tip end of the resonating arm from the base, and the non-electrode region is provided in the sloped surface.

According to this configuration, in the flexural resonator element, the bottom portion of the groove has the sloped surface which is inclined so that the depth of the groove increases as it approaches the tip end of the resonating arm from the base, and the non-electrode region is provided in the sloped surface. Therefore, for example, when an electrode protective film (resist) is subjected to patterning using photolithography to form the non-electrode region, it is possible to prevent a non-exposure portion (the first and second side surfaces or the like) from being irradiated with exposure light through reflection of light.

APPLICATION EXAMPLE 7

In the flexural resonator element of the above application example, it is preferable that the resonating arm includes an arm portion which is disposed close to the base, and a weight portion which is disposed closer to a tip end of the resonating arm than the arm portion.

According to this configuration, in the flexural resonator element, the resonating arm includes an arm portion which is disposed close to the base, and a weight portion which is disposed closer to a tip end of the resonating arm than the arm portion. Through the effect of improving the Q value by the weight portion which increases the inertial mass, it is possible to shorten the resonating arm while maintaining the Q value, for example.

Therefore, in the flexural resonator element, it is possible to achieve further miniaturization while maintaining the Q value.

On the other hand, when the weight portion is provided in the flexural resonator element, for example, the amount of deformation of the connection portion during flexural vibration, for example, increases as compared to a configuration in which no weight portion is provided. That is, the heat generated increases.

However, in the flexural resonator element, the thermal conductivity in the non-electrode region in the bottom portion of the groove corresponding to the slope portion decreases as compared to a case in which an electrode is formed. Thus, the transfer of heat from the contracted portion to the expanded portion is slowed down. Accordingly, the thermoelastic loss in the connection portion can be suppressed more effectively when the weight portion is provided.

APPLICATION EXAMPLE 8

In the flexural resonator element of the above application example, it is preferable that the flexural resonator element includes a plurality of the resonating arms, and the plurality of resonator arms and the base form a tuning fork.

According to this configuration, the flexural resonator element includes a plurality of the resonating arms and the base which form a tuning fork. Thus, it is possible to provide a tuning fork-type flexural resonator element having the effects of any one of the above-mentioned application examples.

APPLICATION EXAMPLE 9

According to this application example of the invention, there is provided a resonator including the flexural resonator element of any one of the above-mentioned application examples and a package that accommodates the flexural resonator element.

According to this configuration, since the resonator includes the flexural resonator element of any one of the above-mentioned application examples, it is possible to provide a resonator having the effects of any one of the above-mentioned application examples.

APPLICATION EXAMPLE 10

According to this application example of the invention, there is provided an oscillator including the flexural resonator element of any one of the above-mentioned application examples and a circuit element that has a circuit oscillating the flexural resonator element.

According to this configuration, since the oscillator includes the flexural resonator element of any one of the above-mentioned application examples, it is possible to provide an oscillator having the effects of any one of the above-mentioned application examples.

APPLICATION EXAMPLE 11

According to this application example of the invention, there is provided an electronic device including the flexural resonator element of any one of the above-mentioned application examples.

According to this configuration, since the electronic device includes the flexural resonator element of any one of the above-mentioned application examples, it is possible to provide an electronic device having the effects of any one of the above-mentioned application examples.

BRIEF DESCRIPTION OF THE DRAWINGS

The invention will be described with reference to the accompanying drawings, wherein like numbers reference like elements.

FIGS. 1A to 1C are schematic diagrams showing a simplified configuration of a flexural resonator element according to a first embodiment, in which FIG. 1A is a plan view, and FIGS. 1B and 1C are cross-sectional views of FIG. 1A.

FIGS. 3A and 3B are schematic diagrams showing a simplified configuration of a flexural resonator element according to a first modification, in which FIG. 3A is a plan view, and FIG. 3B is a cross-sectional view of FIG. 3A.

FIGS. 4A and 4B are schematic diagrams showing a simplified configuration of a flexural resonator element according to a second modification, in which FIG. 4A is a plan view, and FIG. 4B is a cross-sectional view of FIG. 4A.

FIGS. 6A and 6B are schematic diagrams showing a simplified configuration of a resonator according to a second embodiment, in which FIG. 6A is a plan view, and FIG. 6B is a cross-sectional view of FIG. 6A.

FIGS. 7A and 7B are schematic diagrams showing a simplified configuration of an oscillator according to a third embodiment, in which FIG. 7A is a plan view, and FIG. 7B is a cross-sectional view of FIG. 7A.

DESCRIPTION OF EXEMPLARY EMBODIMENTS

Hereinafter, embodiments of the invention will be described with reference to the drawings.

First Embodiment

Figure 1A:
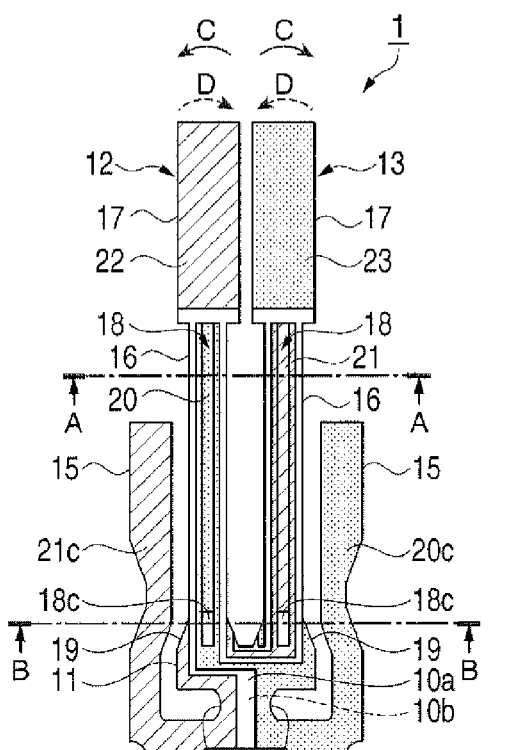
Figure 1B:
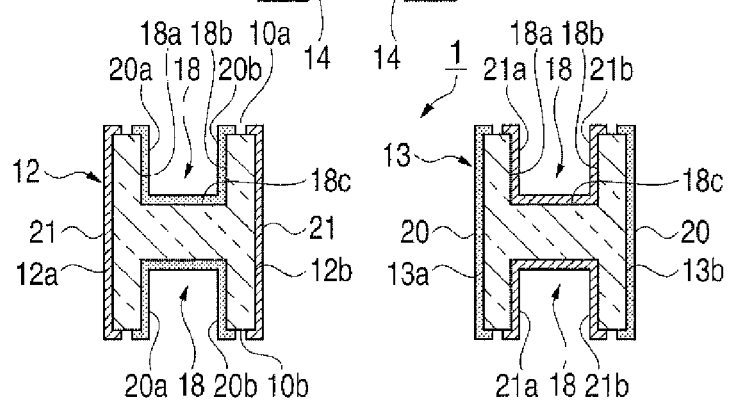
Figure 1C:
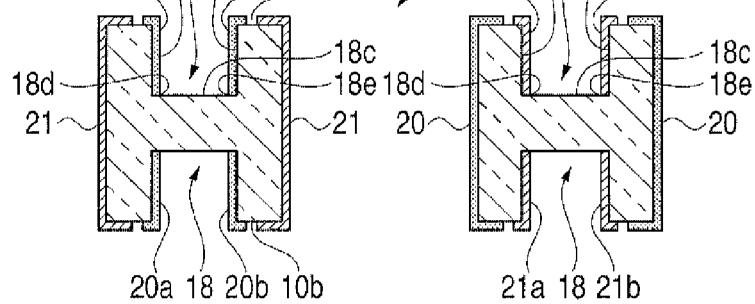

FIGS. 1A and 1B are schematic diagrams showing a simplified configuration of a flexural resonator element according to a first embodiment, in which FIG. 1A is a plan view, FIG. 1B is a cross-sectional view taken along the line A-A in FIG. 1A, and FIG. 1C is a cross-sectional view taken along the line B-B in FIG. 1A.

In FIG. 1A, hatching or shading is added to electrode parts for the sake of convenience, and the electrode parts are simplified or partially omitted for better understanding of the drawing. Moreover, in FIG. 1C, the cross-section of a part (supporting portion) of the constituent elements is omitted.

As shown in FIGS. 1A to 1C, a crystal resonator element 1 used as a flexural resonator element is a flexural resonator element of which the outer shape is formed by photolithographically etching (wet-etching) a wafer-shaped crystal substrate which is used as a base material and which is cut, for example, from crystal ore, at predetermined angles.

The crystal resonator element 1 includes a base 11, a pair of resonating arms 12 and 13 extending approximately in parallel from the base 11, a pair of notches 14 which is notched from both sides of the base 11 in a direction (the left-right direction of the drawing sheet) crossing the extension direction of the resonating arms 12 and 13, namely in the width direction of the resonating arms 12 and 13, and a pair of supporting portions 15 protruding from the base 11 in the left-right direction of the drawing sheet, bent approximately at a right angle towards the resonating arms 12 and 13, and extending along the resonating arms 12 and 13.

The pair of resonating arms 12 and 13 includes an arm portion 16 positioned close to the base 11 and a weight portion 17 positioned closer to the tip end of each of the resonating arms 12 and 13 than the arm portion 16 and having a larger width than the arm portion 16.

Moreover, the pair of resonating arms 12 and 13 includes a groove 18 which is formed on principal surfaces 10a and 10b facing each other so as to extend along the longitudinal direction of the pair of resonating arms 12 and 13 and which is cut along the arrangement direction (the left-right direction of the drawing sheet) of the pair of resonating arms 12 and 13 so that the resonating arms 12 and 13 have an approximately H-shape in cross-sectional view.

The crystal resonator element 1 includes a slope portion 19 which is formed in a connection portion adjacent to the base 11 so that a distance between the groove 18 and the outer edge of each of the resonating arms 12 and 13 increases as it approaches the base 11 from the resonating arms 12 and 13 in plan view.

The crystal resonator element 1 includes excitation electrodes 20 and 21 which are formed (disposed) on the groove 18 of the pair of resonating arms 12 and 13, the principal surfaces 10a and 10b, and the mutually facing side surfaces 12a and 12b, and 13a and 13b of the pair of resonating arms 12 and 13.

Next, the excitation electrodes 20 and 21 formed on the groove 18 will be described.

As shown in FIG. 1B, the groove 18 includes a bottom portion 18c, a first side surface 18a that is positioned on one side in the width direction of the resonating arms 12 and 13 with respect to the bottom portion 18c and formed along the longitudinal direction of the resonating arms 12 and 13, and a second side surface 18b that is positioned on the other side in the width direction of the resonating arms 12 and 13 with respect to the bottom portion 18c and formed along the longitudinal direction of the resonating arms 12 and 13.

Moreover, the excitation electrodes 20 and 21 of the groove 18 in the arm portion 16 are formed to be continuous to the first side surface 18a formed along the longitudinal direction of the groove 18, the bottom portion 18c, and the second side surface 18b facing the first side surface 18a with the bottom portion 18c disposed therebetween.

On the other hand, as shown in FIG. 1C, a non-electrode region which extends over a range of areas from a connection portion 18d connected to the first side surface 18a and a connection portion 18e connected to the second side surface 18b and in which the excitation electrodes 20 and 21 are not formed is provided in at least a part of the bottom portion 18c positioned in the slope portion 19. Here, the expression "a part" corresponds to "a part of the groove" described in the application examples of the invention, the non-electrode region is provided in the entire bottom portion 18c positioned in the slope portion 19. The non-electrode region is a portion which is not shaded in FIG. 1A as denoted by reference numeral 18c.

First excitation electrode portions 20a and 21a which are part of the excitation electrodes 20 and 21 are formed (disposed) on the first side surfaces 18a positioned in the slope portions 19. Second excitation electrode portions 20b and 21b which are part of the excitation electrodes 20 and 21 are formed (disposed) on the second side surfaces 18b positioned in the slope portions 19.

In the crystal resonator element 1, the excitation electrodes 20 and 21 are formed on the entire area of the first and second side surfaces 18a and 18b of the groove 18.

As shown in FIGS. 1A to 1C, the crystal resonator element 1 includes the base 11 and the pair of resonating arms 12 and 13 which form a tuning fork, whereby a tuning fork-type crystal resonator element used as a tuning fork-type flexural resonator element is obtained. The crystal resonator element 1 is fixed to an external member such as a package at a predetermined position of each of the supporting portions 15.

In the crystal resonator element 1, when an external driving signal is applied to the excitation electrodes 20 and 21 formed on the pair of resonating arms 12 and 13, the pair of resonating arms 12 and 13 alternately vibrate (resonate) in the flexural vibration mode at a predetermined frequency (for example, 32.768 kHz) in the directions indicated by the arrows C and D.

Next, the excitation electrodes 20 and 21 formed on the pair of resonating arms 12 and 13 will be described in detail.

On the pair of resonating arms 12 and 13, the excitation electrodes 20 and 21 to which driving signals different in the polarity of the applied potential from each other are applied from the outside are formed.

Therefore, the excitation electrodes 20 and 21 are formed to be spaced from each other so that they are not short-circuited.

As shown in FIGS. 1B and 1C, the excitation electrode 20 is formed on the groove 18 of the resonating arm 12, and the excitation electrode 21 is formed on both side surfaces 12a and 12b of the resonating arm 12.

The excitation electrodes 21 on both side surfaces 12a and 12b of the resonating arm 12 are connected to each other by a connection electrode 22 (see FIG. 1A) formed on the weight portion 17.

On the other hand, the excitation electrode 21 is formed on the groove 18 of the resonating arm 13, and the excitation electrode 20 is formed on both side surfaces 13a and 13b of the resonating arm 13.

The excitation electrodes 20 on both side surfaces 13a and 13b of the resonating arm 13 are connected to each other by a connection electrode 23 (see FIG. 1A) formed on the weight portion 17.

The excitation electrode 20 on the principal surface 10a side of the groove 18 of the resonating arm 12 and the excitation electrode 20 on the principal surface 10b side are connected to each other by the excitation electrodes 20 formed on both side surfaces 13a and 13b of the resonating arm 13.

On the other hand, the excitation electrode 21 on the principal surface 10a side of the groove 18 of the resonating arm 13 and the excitation electrode 21 on the principal surface 10b side are connected to each other by the excitation electrodes 21 formed on both side surfaces 12a and 12b of the resonating arm 12.

As shown in FIG. 1A, the excitation electrodes 20 and 21 are led out up to the supporting portions 15 through the base 11, and the lead-out portions serve as mount electrodes 20c and 21c which are used when the crystal resonator element 1 is fixed to the external member such as a package. The mount electrodes 20c and 21c are formed on both principal surfaces 10a and 10b.

Next, an overview of a method of forming the excitation electrodes 20 and 21 will be described.

The excitation electrodes 20 and 21 are formed in a desired electrode pattern shape by the following steps. First, an electrode material such as Ni, Cr, Au, Ag, Al, or Cu is applied to approximately the entire surface of the crystal resonator element 1 by a method such as deposition or sputtering. Subsequently, a photosensitive resist is applied so as to cover the applied electrode material and is subjected to exposure and patterning in accordance with a desired electrode pattern shape using a photolithography technique. After that, unnecessary exposed portions of the electrode material are removed by etching, whereby the excitation electrodes 20 and 21 having a desired electrode pattern shape are obtained.

Moreover, thermal conductivity of a quartz crystal is about 6.2 to about 10.4 W/(m·K), and thermal conductivity of Au, for example, used as the electrode material of the excitation electrodes 20 and 21 is about 315 W/(m·K) which is much larger than that of a quartz crystal. The same can be said for the other electrode materials (Ni, Cr, and the like).

Next, the thermoelastic loss and the relaxation frequency will be described.

For the sake of simplicity, the description will be provided with regard to one resonating arm 12. When the crystal resonator element 1 is in the resonating state, and the resonating arm 12 is vibrated toward one side in the width direction thereof, tensile stress acts on one side in the width direction of the resonating arm 12 and compressive stress acts on the other side. Generally, the tensile stress and compressive stress acting on the connection portion of the resonating arm 12 adjacent to the base 11 are larger than the stresses acting on the tip end of the resonating arm 12.

At that time, the temperature increases in the regions where compressive stress acts, and decreases in the regions where tensile stress acts.

The crystal resonator element 1 loses vibration energy due to heat transfer (thermal conduction) occurring due to equilibration of temperature between the contracted portion of the resonating arm 12 resonating in the flexural vibration mode where compressive stress acts and the expanded portion where tensile stress acts.

A decrease in the Q value caused by such thermal conduction is referred to as thermoelastic loss.

From the relationship between deformation and stress which is well-known as a phenomenon of internal friction of a solid generally occurring due to a temperature difference, the thermoelastic loss is described as follows. In a flexural vibration-mode resonator element, when the vibration frequency changes, the Q value reaches the minimum at a relaxation vibration frequency fm=$1/2\pi\tau$ (here, $\pi$ is the circular constant, and $\tau$ is the relaxation time).

Figure 2:
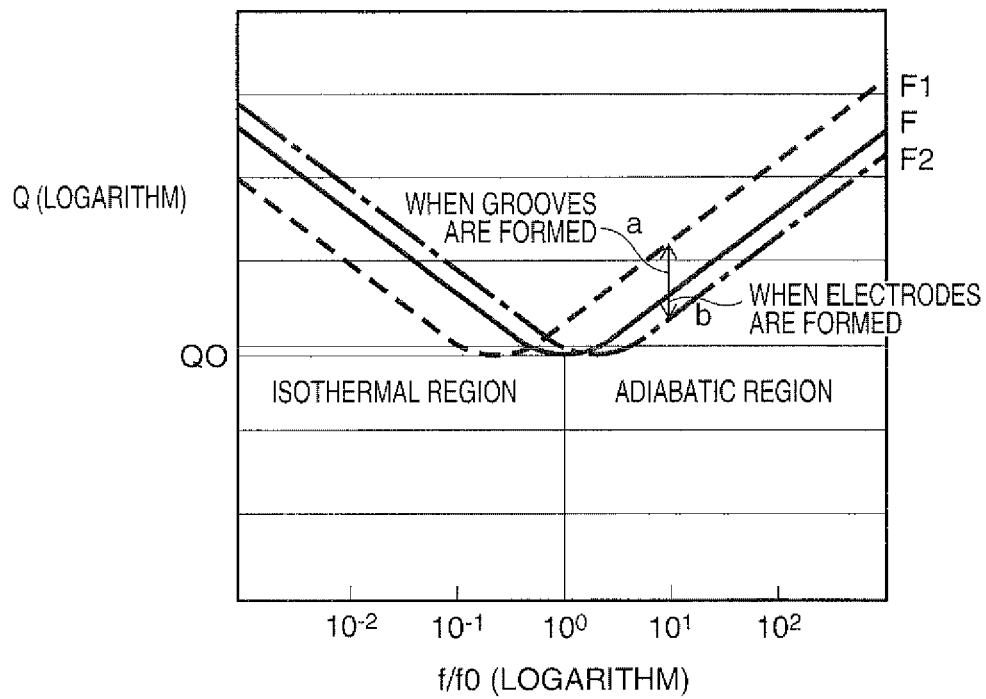
FIG. 2 is a diagram showing the relationship between a relaxation frequency of the flexural resonator element and the minimum value of the Q value.

The relationship between the Q value and the frequency is generally expressed as a curve F in FIG. 2, in which the curve F represents the relationship between the relaxation frequency of the flexural resonator element and the minimum value of the Q value. In the drawing, the frequency at which the Q value reaches the minimum Q0 is a thermal relaxation frequency f0 (=$1/2\pi\tau$).

Moreover, a region (1<f/f0) on the high frequency side in relation to a boundary of f/f0=1 is an adiabatic region, and a region (f/f0<1) on the low frequency side in relation to the boundary is an isothermal region.

When the groove 18 is formed in the resonating arms 12 and 13 of the crystal resonator element 1, a thermal conduction path between the contracted portion and the expanded portion of the resonating arms 12 and 13 is narrowed in the midway by the groove 18. Thus, in the crystal resonator element 1, a relaxation time $\tau$ up to the equilibration of the temperature of the contracted portion and the expanded portion increases.

Therefore, in the crystal resonator element 1, since the groove 18 is formed, in the adiabatic region shown in FIG. 2, the shape of the curve F itself does not change, but with a decrease of the thermal relaxation frequency f0, the curve F shifts to the position of a curve F1 in the lower frequency direction. The curve F1 shows a state in which no electrode (excitation electrode 20 or 21) is formed in the groove 18.

As a result, in the crystal resonator element 1, the Q value increases as indicated by the arrow a.

However, in the crystal resonator element 1, when the excitation electrodes 20 and 21 are formed in the groove 18, the curve F shifts to the position of a curve F2, and the Q value decreases as indicated by the arrow b.

A thermal conduction path formed by the excitation electrodes 20 and 21 can be considered as one of the reasons thereof.

That is, a conductive material such as an electrode material has higher thermal conductivity than a quartz crystal which is a piezoelectric material used as the base material of the crystal resonator element 1. In such a conductive material, electrons as well as phonons of metal carry thermal energy.

Specifically, in the crystal resonator element 1, since thermal conduction is carried out by the excitation electrodes 20 and 21 formed on the groove 18 as well as a quartz crystal, it is considered that the relaxation time $\tau$ decreases, and with an increase of the thermal relaxation frequency f0, the curve F shifts to the position of the curve F2 in the higher frequency direction.

The crystal resonator element 1 of the first embodiment is designed to operate in a region in which the thermoelastic loss is in the adiabatic region, namely a high-frequency region in which the value of fr/f0 satisfies a relation of 1<fr/f0 where fr is the mechanical resonance frequency of a resonating body and f0 is the thermal relaxation frequency of a simple resonating body. Here, the simple resonating body means a resonating body on which no metal film or the like such as the excitation electrodes 20 and 21 is formed. For example, when a quartz crystal is used as the material of the resonating body, a simple resonating body means a resonating body on which no material other than the quartz crystal is formed.

Generally, a thermal relaxation frequency fm is calculated by Equation (1) below.

$$fm = \pi k/(2\rho C_p a^2) \quad (1)$$

Here, $\pi$ is the circular constant, k is a thermal conductivity in the resonating direction of a resonating arm, $\rho$ is a mass density of the resonating arm, $C_p$ is heat capacity of the resonating arm, and a is the width in the resonating direction of the resonating arm.

When the constants of the material of the resonating arm are substituted into the thermal conductivity k, the mass density $\rho$, and the heat capacity $C_p$ in Equation 1, the obtained thermal relaxation frequency fm becomes the thermal relaxation frequency when no groove is formed in the resonating arm.

As described above, in the crystal resonator element 1 of the first embodiment, the non-electrode region which extends over a range of areas from the connection portion 18d connected to the first side surface 18a and the connection portion 18e connected to the second side surface 18b and in which the excitation electrodes 20 and 21 are not formed is provided in at least a part of the bottom portion 18c of the groove 18 corresponding to the slope portion 19.

As a result, in the crystal resonator element 1 operating in the adiabatic region, the thermal conductivity in the non-electrode region of the bottom portion 18c of the groove 18 corresponding to the slope portion 19 decreases as compared to a case in which the excitation electrodes 20 and 21 are formed. Thus, the transfer of heat from the contracted portion (for example, the first side surface 18a side) during the flexural vibration to the expanded portion (for example, the second side surface 18b side) is slowed down. Accordingly, it is possible to suppress the thermoelastic loss of the slope portion 19.

Therefore, in the crystal resonator element 1, it is possible to improve the Q value as compared to a case in which the excitation electrodes 20 and 21 are formed in the bottom portion 18c of the groove 18 corresponding to the slope portion 19.

In the crystal resonator element 1, in order to obtain the effects more securely, as shown in FIG. 1A, it is preferable that the non-electrode region is provided in the entire range of the bottom portion 18c of the groove 18 corresponding to the slope portion 19.

Since the crystal resonator element 1 has the excitation electrodes 20 and 21 which are formed on the entire area of the first and second side surfaces 18a and 18b of the groove 18, it is possible to decrease the CI value as compared to a case described later in which the excitation electrodes 20 and 21 are formed in part of the first and second side surfaces 18a and 18b of the groove 18.

Therefore, in the crystal resonator element 1, it is possible to improve the Q value as compared to a case in which the excitation electrodes 20 and 21 are formed in part of the first and second side surfaces 18a and 18b of the groove 18.

Moreover, in the crystal resonator element 1, the resonating arms 12 and 13 include the arm portion 16 which is disposed close to the base 11, and the weight portion 17 which is disposed closer to the tip end of each of the resonating arms than the arm portion 16 and which has a larger width than the arm portion 16. Through the effect of improving the Q value by the weight portion 17 which increases the inertial mass, it is possible to shorten the resonating arms 12 and 13 while maintaining the Q value, for example.

Therefore, in the crystal resonator element 1, it is possible to achieve further miniaturization while maintaining the Q value.

On the other hand, when the weight portion 17 is provided in the crystal resonator element 1, the amount of deformation during flexural vibration increases as compared to a configuration in which no weight portion 17 is provided. That is, the heat generated increases.

However, in the crystal resonator element 1, the thermal conductivity in the non-electrode region of the bottom portion 18c of the groove 18 corresponding to the slope portion 19 decreases as compared to a case in which the excitation electrodes 20 and 21 are formed. Thus, the transfer of heat from the contracted portion to the expanded portion is slowed down. Accordingly, the thermoelastic loss of the slope portion 19 can be suppressed more effectively when the weight portion 17 is provided.

Moreover, the crystal resonator element 1 includes a pair (two) of resonating arms 12 and 13 and the base 11 which form a tuning fork. Thus, it is possible to provide a tuning fork-type crystal resonator element having the above-described effects.

Next, modifications of the first embodiment will be described.

First Modification

Figure 3A:
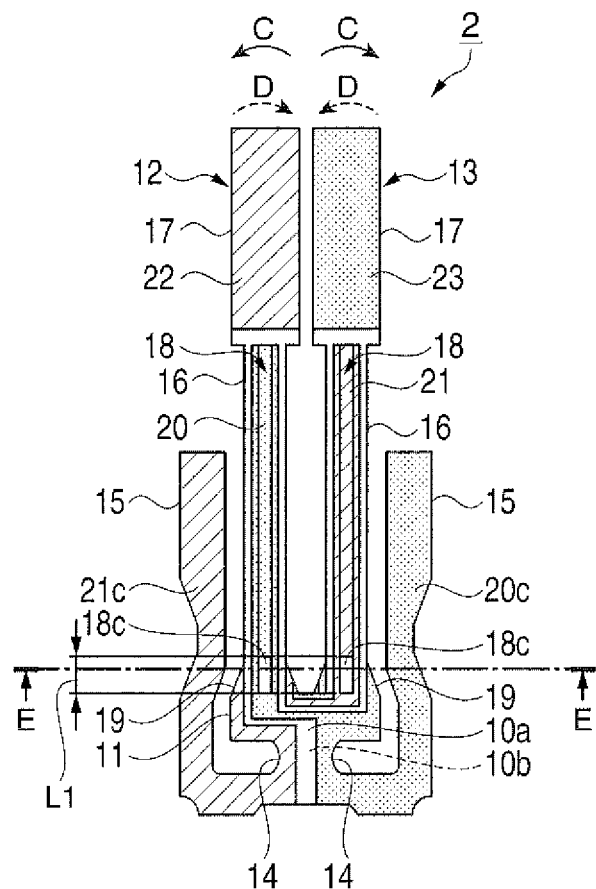
Figure 3B:
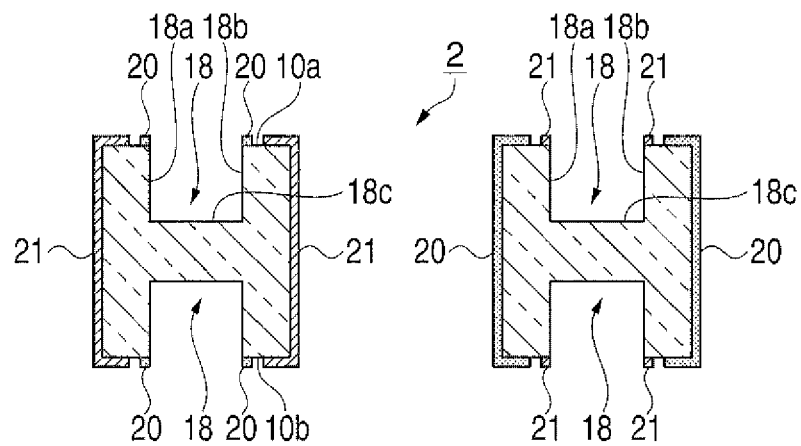

FIGS. 3A and 3B are schematic diagrams showing a simplified configuration of a flexural resonator element according to a first modification, in which FIG. 3A is a plan view, and FIG. 3B is a cross-sectional view taken along the line E-E in FIG. 3A. The same portions as those of the first embodiment will be denoted by the same reference numerals, detailed description thereof will be omitted, and those portions different from those of the first embodiment will be described.

As shown in FIGS. 3A and 3B, in a crystal resonator element 2 as a flexural resonator element of the first embodiment, the excitation electrodes 20 and 21 are not formed in a range L1 of areas of the first and second side surfaces 18a and 18b of the groove 18 corresponding to the slope portion 19.

In other words, the crystal resonator element 2 includes the excitation electrodes 20 and 21 which are formed in part of the first and second side surfaces 18a and 18b of the groove 18.

According to this configuration, since the crystal resonator element 2 includes the excitation electrodes 20 and 21 which are formed in part of the first and second side surfaces 18a and 18b of the groove 18, the area of the excitation electrodes 20 and 21 in the first and second side surfaces 18a and 18b of the groove 18 is smaller than the above-described case in which the excitation electrodes 20 and 21 are formed on the entire area of the first and second side surfaces 18a and 18b.

Due to this configuration, since the motional capacitance of the crystal resonator element 2 decreases, it is possible to decrease the load capacitance sensitivity.

Therefore, in the crystal resonator element 2, it is possible to suppress changes in the frequency resulting, for example, from floating capacitance or the like as compared to a case in which the excitation electrodes 20 and 21 are formed on the entire area of the first and second side surfaces 18a and 18b of the groove 18.

Second Modification

Figure 4A:
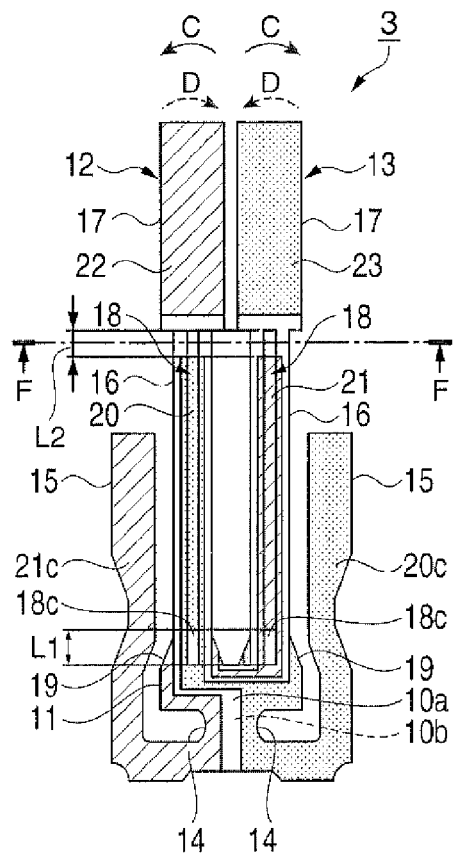
Figure 4B:
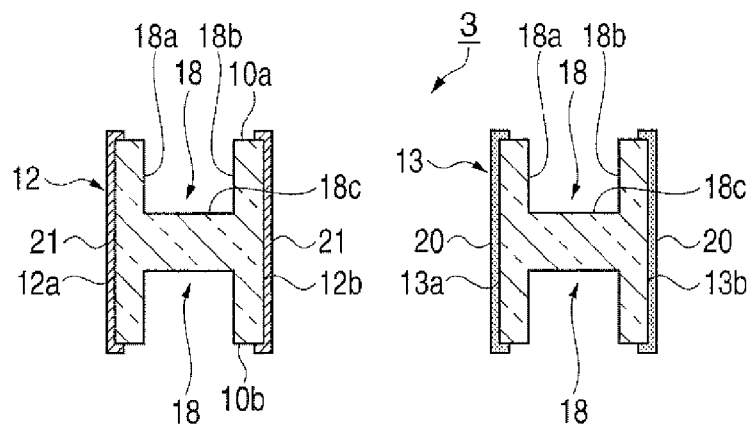

FIGS. 4A and 4B are schematic diagrams showing a simplified configuration of a flexural resonator element according to a second modification, in which FIG. 4A is a plan view, and FIG. 4B is a cross-sectional view taken along the line F-F in FIG. 4A. The same portions as those of the first embodiment will be denoted by the same reference numerals, detailed description thereof will be omitted, and those portions different from those of the first embodiment will be described.

As shown in FIGS. 4A and 4B, in a crystal resonator element 3 as a flexural resonator element of the second embodiment, the excitation electrodes 20 and 21 are not formed in a partial range L2 of areas of the first and second side surfaces 18a and 18b and the bottom portion 18c disposed close to the weight portion 17 of the groove 18 as well as in the range L1 of areas of the first and second side surfaces 18a and 18b of the groove 18 corresponding to the slope portion 19 described in the first modification.

According to this configuration, in the crystal resonator element 3, the area of the excitation electrodes 20 and 21 in the first and second side surfaces 18a and 18b of the groove 18 decreases further as compared to the first embodiment and the first modification.

Due to this configuration, since the motional capacitance of the crystal resonator element 3 decreases further, it is possible to further decrease the load capacitance sensitivity.

Therefore, in the crystal resonator element 3, it is possible to further suppress changes in the frequency resulting, for example, from floating capacitance or the like as compared to the first embodiment and the first modification.

In addition, since the excitation electrodes 20 and 21 are not formed in the bottom portion 18c in the partial range L2 of areas on the weight portion 17 side of the groove 18, the transfer of heat from the contracted portion (for example, the first side surface 18a side) during the flexural vibration in the range L2 to the expanded portion (for example, the second side surface 18b side) is slowed down. Accordingly, it is possible to suppress the thermoelastic loss.

Therefore, in the crystal resonator element 3, it is possible to further improve the Q value as compared to the first embodiment and the first modification.

Third Modification

Figure 5:
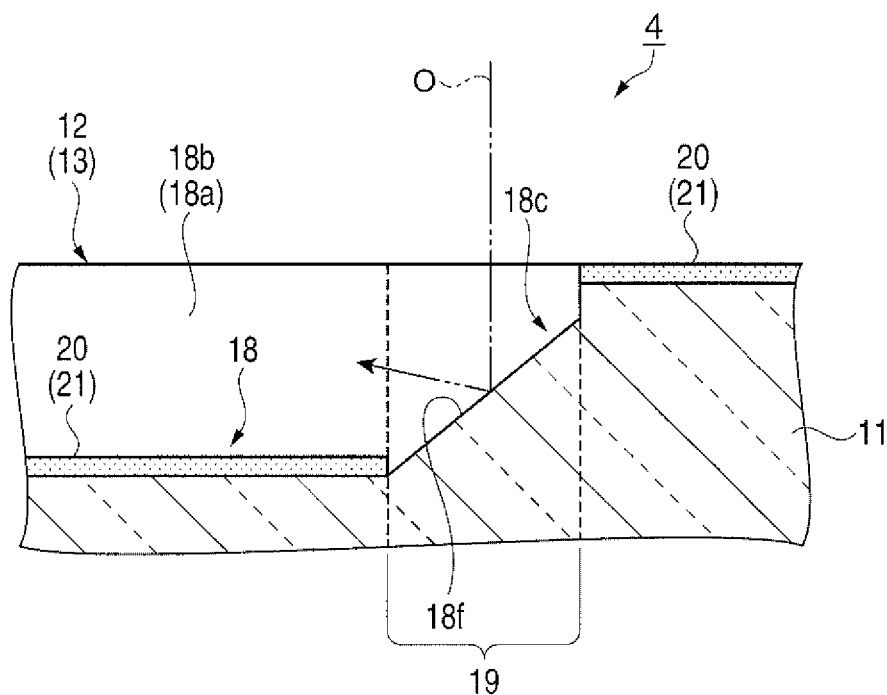
FIG. 5 is a schematic cross-sectional view of a main part of a flexural resonator element according to a third modification.

FIG. 5 is a schematic cross-sectional view of a main part of a flexural resonator element according to a third modification.

FIG. 5 is a cross-sectional view of a main part on the base 11 side of the groove 18, of a crystal resonator element 4 as a flexural resonator element according to the third modification taken along the extension direction of the resonating arms 12 and 13.

The other configurations of the crystal resonator element 4 other than the groove 18 shown in FIG. 5 are the same as those of the first embodiment and the respective modifications.

As shown in FIG. 5, when the groove 18 is formed by wet-etching, for example, the bottom portion 18c of the groove 18 of the crystal resonator element 4 corresponding to the slope portion 19 has a sloped surface 18f which is inclined so that the depth of the groove 18 increases as it approaches the tip ends of the resonating arms 12 and 13 from the base 11 side.

Moreover, the bottom portion 16c of the groove 18 of the crystal resonator element 4 corresponding to the slope portion 19 has a non-electrode region which is provided on the sloped surface 18f.

Moreover, the sloped surface 18f is not inclined toward the first or second side surface 18a or 18b when the sloped surface 18f is cut along the direction crossing the extension direction of the resonating arms 12 and 13.

According to this configuration, in the crystal resonator element 4, the bottom portion 18c of the groove 18 of the crystal resonator element 4 corresponding to the slope portion 19 has the sloped surface 18f which is inclined so that the depth of the groove 18 increases as it approaches the tip ends of the resonating arms 12 and 13 from the base 11 side, and the non-electrode region is provided on the sloped surface 18f. When a resist is subjected to patterning using photolithography to form the electrode pattern of the excitation electrodes 20 and 21, it is possible to prevent a non-exposure portion (the first and second side surfaces 18a and 18b or the like) from being irradiated with exposure light through reflection of light.

Specifically, exposure light O illuminated from above the groove 18 toward the sloped surface 18f is reflected from the sloped surface 18f of the bottom portion 18c. However, since the sloped surface 18f is inclined so that the depth of the groove 18 increases as it approaches the tip ends of the resonating arms 12 and 13 from the base 11, the reflected light is reflected at an angle corresponding to its incidence angle toward the tip ends of the resonating arms 12 and 13 along the extension direction of the resonating arms 12 and 13.

As a result, in the crystal resonator element 4, it is possible to prevent the non-exposure portion (the first and second side surfaces 18a and 18b or the like) from being irradiated with the exposure light O through reflection of light when the resist is subjected to patterning using photolithography to form the electrode pattern of the excitation electrodes 20 and 21.

Here, in the sloped surface 18f of the bottom portion 18c, the positions of both ends in the left-right direction of the drawing sheet in FIG. 5 are not necessarily identical to the positions of both ends of the slope portion 19. For example, the end of the sloped surface 18f of the bottom portion 18c on the tip end side (the left side of the drawing sheet) of the resonating arms 12 and 13 may be outside the slope portion 19 and may be within the slope portion 19.

Second Embodiment

Next, a resonator having the crystal resonator element described above will be described as a second embodiment.

Figure 6A:
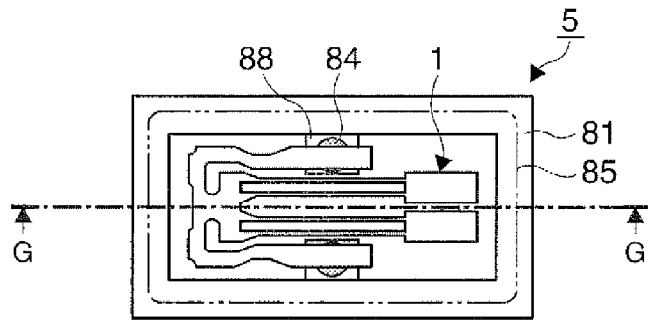
Figure 6B:
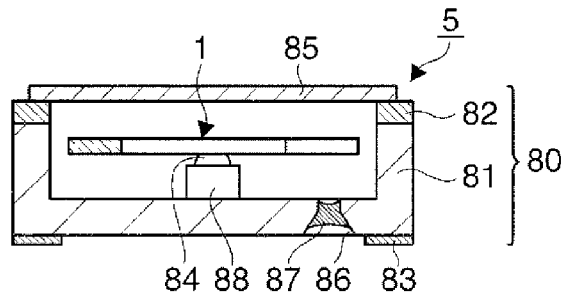

FIGS. 6A and 6B are schematic diagrams showing a simplified configuration of a resonator according to the second embodiment, in which FIG. 6A is a plan view, and FIG. 6B is a cross-sectional view taken along the line G-G in FIG. 6A. The electrodes of the crystal resonator element are not illustrated for better understanding of the drawings.

As shown in FIGS. 6A and 6B, a crystal resonator 5 as a resonator includes the crystal resonator element 1 of the first embodiment and a package 80 that accommodates the crystal resonator element 1.

The package 80 includes a package base 81, a shim ring 82, a cover 85, and the like.

The package base 81 has a recess so that the crystal resonator element 1 can be accommodated therein, and connection pads 88 connected to the mount electrodes 20c and 21c (not shown; see FIGS. 1A and 1B) of the crystal resonator element 1 are provided in the recess.

The connection pads 88 are connected to wirings inside the package base 81 so as to be electrically connected to an external connection terminal 83 provided at the periphery of the package base 81.

The shim ring 82 is provided around the recess of the package base 81. A through-hole 86 is provided on the bottom of the package base 81.

The crystal resonator element 1 is attached to the connection pads 88 of the package base 81 by a conductive adhesive 84. In the package 80, the cover 85 covering the recess of the package base 81 is shim-welded to the shim ring 82.

A sealing material 87 made from metal is filled in the through-hole 86 of the package base 81. The sealing material 87 is melted in a depressurized atmosphere and solidified to airtightly seal the through-hole 86 so that the inside of the package base 81 is maintained in the depressurized state.

The crystal resonator 5 oscillates (resonates) at a predetermined frequency (for example, 32.768 kHz) when the crystal resonator element 1 is excited by an external driving signal supplied through the external connection terminal 83.

As described above, since the crystal resonator 5 includes the crystal resonator element 1, it is possible to provide a crystal resonator having the same effects (improvement in the Q value, for example) as the first embodiment.

Even when any one of the crystal resonator elements 2, 3, and 4 is used in place of the crystal resonator element 1, the crystal resonator 5 can provide the effects corresponding to the crystal resonator elements 2, 3, and 4.

Third Embodiment

Next, an oscillator having the crystal resonator element described above will be described as a third embodiment.

Figure 7A:
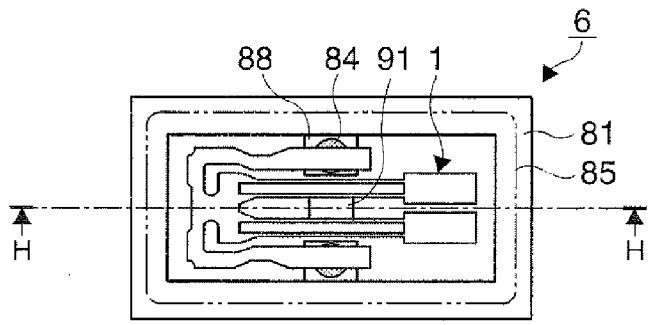
Figure 7B:
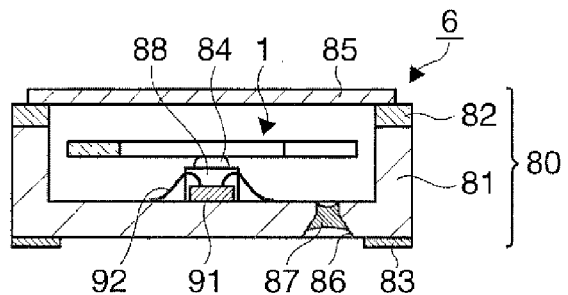

FIGS. 7A and 7B are schematic diagrams showing a simplified configuration of an oscillator according to the third embodiment, in which FIG. 7A is a plan view, and FIG. 7B is a cross-sectional view taken along the line H-H in FIG. 7A. The electrodes of the crystal resonator element are not illustrated for better understanding of the drawings.

A crystal oscillator 6 as an oscillator has a configuration in which the crystal resonator 5 described above further includes a circuit element. The same portions as the crystal resonator 5 will be denoted by the same reference numerals, and description thereof is omitted.

As shown in FIGS. 7A and 7B, the crystal oscillator 6 includes the crystal resonator element 1 of the first embodiment, an IC chip 91 as a circuit element having an oscillation circuit that oscillates the crystal resonator element 1, and the package 80 that accommodates the crystal resonator element 1 and the IC chip 91.

The IC chip 91 is attached to the bottom of the package base 81 and is connected to other wirings by metal wires 92 such as Au or Al.

The crystal oscillator 6 oscillates (resonates) at a predetermined frequency (for example, 32.768 kHz) when the crystal resonator element 1 is excited by a driving signal supplied from the oscillation circuit of the IC chip 91.

As described above, since the crystal oscillator 6 includes the crystal resonator element 1, it is possible to provide a crystal oscillator having the same effects (improvement in the Q value, for example) as the first embodiment.

Even when any one of the crystal resonator elements 2, 3, and 4 is used in place of the crystal resonator element 1, the crystal oscillator 6 can provide the effects corresponding to the crystal resonator elements 2, 3, and 4.

Fourth Embodiment

Figure 8:
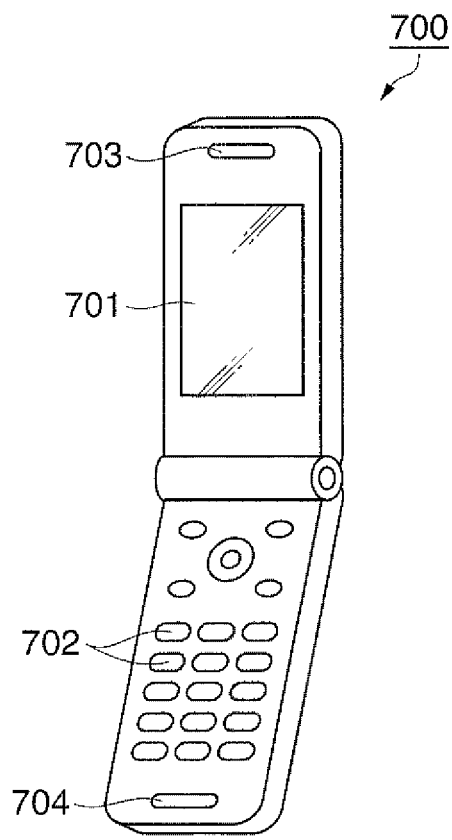
FIG. 8 is a schematic perspective view showing an electronic device according to a fourth embodiment.

Next, an electronic device having the crystal resonator element described above will be described as a fourth embodiment. FIG. 8 is a schematic perspective view showing an electronic device of the fourth embodiment.

As shown in FIG. 8, a portable phone 700 as the electronic device includes the crystal resonator 5 or the crystal oscillator 6 having the crystal resonator element (1 or the like) described above as a timing device, for example, and further includes, a liquid crystal display 701, a plurality of operation buttons 702, an ear piece 703, and a mouth piece 704.

The crystal resonator 5 and the crystal oscillator 6 described above can be advantageously used as a timing device for electronic books, personal computers, televisions, digital cameras, video camcorders, video recorders, car navigators, pagers, electronic notebooks, electronic calculators, word processors, workstations, video phones, POS terminals, apparatuses having touch panels, and the like without being limited to the portable phone. In any case, the effects described in the respective embodiments and the respective modifications can be obtained, and the operation properties of these electronic devices can be improved.

In the respective embodiments and the respective modifications, the supporting portion 15 and the weight portion 17 of each of the crystal resonator elements 1, 2, 3, and 4 may not be provided.

In the respective embodiments and the respective modifications, although the weight portion 17 of each of the crystal resonator elements 1, 2, 3, and 4 has a structure such that it is disposed closer to the tip end of each of the resonating arms 12 and 13 than the arm portion 16 and has a larger width than the arm portion 16, the structure of the weight portion 17 is not limited to this but the weight portion 17 having a different structure can be also used.

For example, a weight portion 17 which is disposed closer to the tip end than the arm portion 16 of the pair of resonating arms 12 and 13 and which has a thickness larger than that of the arm portion 16 can be also used. Moreover, a weight portion 17 which is disposed closer to the tip end than the arm portion 16 and in which a member (for example, a member formed of a metal such as Au or Cu) formed of a material having a mass density higher than that of the base materials of the crystal resonator elements 1, 2, 3, and 4 is fixed or embedded can be also used.

The supporting portion 15 is not limited to a pair of supporting portions but may be provided in only one side.

In the respective embodiments and the respective modifications, although the groove 18 has the bottom portion 18c, the first side surface 18a, and the second side surface 18b and has a so-called H-shape in cross-sectional view, the shape of the groove 18 is not limited to this. For example, a groove having a so-called V-shape in cross-sectional view which has no bottom portion, and in which the first and second side surfaces are connected to make an acute angle can be also used.

In the respective embodiments and the respective modifications, although the groove 18 is provided on both principal surfaces 10a and 10b of the resonating arms 12 and 13, the invention is not limited to this, and the groove 18 may be provided on only one of the principal surfaces (10a or 10b).

Moreover, in the respective embodiments and the respective modifications, although the number of resonating arms 12 and 13 has been described to be one pair (two), the number of resonating arms is not limited to this but may be one, or three or more.

Furthermore, in the respective embodiments and the respective modifications, although the flexural resonator element is formed of a quartz crystal, the invention is not limited to this. For example, the flexural resonator element may be formed of a piezoelectric material such as lithium tantalate ($LiTaO_3$), lithium tetraborate ($Li_2B_4O_7$), lithium niobate ($LiNbO_3$), lead zirconate titanate (PZT), zinc oxide (ZnO), or aluminum nitride (AlN); or a silicon having a piezoelectric material such as zinc oxide (ZnO) or aluminum nitride (AlN) as a coating thereof.

The entire disclosure of Japanese Patent Application No. 2010-156576, filed Jul. 9, 2010 is expressly incorporated by reference herein.

What is claimed is:

1. An oscillating piece comprising:
   a base; and
   a resonating arm that extends from the base along a first direction and has a groove along the first direction on at least one of two principal surfaces that are in a front and back relationship to each other, wherein an excitation electrode is disposed in the groove,
   the resonating arm includes a free end and a connection end with a connection portion that is connected to the base at the connection end,
   a part of the groove is disposed in the connection portion, and
   the part of the groove includes a non-electrode region in which the excitation electrode is not formed, the non-electrode region being closer to the connection end than to the free end, the non-electrode ending across an entire width of the groove in the connection portion relative to a second direction crossing the first direction.

2. The oscillating piece according to claim 1, wherein a width of the connection portion along the second direction crossing the first direction between an outer edge of the groove and an outer edge of the resonating arm increases as it approaches the base from the free end of the resonating arm.

3. The oscillating piece according to claim 1, wherein the principal surfaces having the groove sandwich an opening portion of the groove in plan view and include a first principal surface and a second principal surface, the first principal surface being aligned along the second direction crossing the first direction, an internal surface of the groove has a first side surface connecting with the first principal surface and a second side surface connecting with the second principal surface, the excitation electrode has a first excitation electrode portion that is disposed on the first side surface and a second excitation electrode portion disposed on the second side surface, and the non-electrode region is disposed between the first and second excitation electrode portions.

4. The oscillating piece according to claim 3, wherein on the internal surface of the part of the groove, the first excitation electrode portion is disposed on the entire surface of the first side surface, and the second excitation portion is disposed on the entire surface of the second side surface.

5. The oscillating piece according to claim 3, wherein on the internal surface of the part of the groove, the first excitation portion is disposed on part of the first side surface, and the second excitation portion is disposed on part of the second side surface.

6. The oscillating piece according to claim 1, wherein an internal surface of the part of the groove disposed in the connection portion includes a sloped surface in which a depth of the groove increases as it approaches the free end of the resonating arm from the base, and wherein the non-electrode region is provided in the sloped surface.

7. The oscillating piece according to claim 1, wherein the resonating arm includes an arm portion that extends from a tip end of the connection portion, and a weight portion that extends from the tip end of the arm portion and whose width along the second direction crossing the first direction is wider than the arm portion.

8. The oscillating piece according to claim 1, wherein the oscillating piece includes a plurality of the resonating arms.

9. A resonator comprising:
the oscillating piece according to claim 1, and
a package that accommodates the oscillating piece.

10. An oscillator comprising:
the oscillating piece according to claim 1, and
a circuit.

11. An electronic device comprising the oscillating piece according to claim 1.

12. The oscillating piece of claim 1, further comprising
a support portion that is connected to the base and is aligned with the resonating arm along the second direction crossing the first direction.

13. The oscillating piece of claim 1, further comprising
a pair of notch portions positioned on the base, each notch portion being aligned along the second direction crossing the first direction.

14. The oscillating piece according to claim 1, wherein
a portion of the non-electrode region closest to the free end of the resonating arm is closer to the connection end than to the free end.

* * * * *